(12) United States Patent
Zhou et al.

(10) Patent No.: US 6,221,812 B1
(45) Date of Patent: Apr. 24, 2001

(54) $J_C$ IN HIGH MAGNETIC FIELD OF BI-LAYER AND MULTI-LAYER STRUCTURES FOR HIGH TEMPERATURE SUPERCONDUCTIVE MATERIALS

(75) Inventors: JiPing Zhou; John T. McDevitt; John B. Goodenough, all of Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/357,198

(22) Filed: Jul. 20, 1999

Related U.S. Application Data

(60) Provisional application No. 60/096,689, filed on Jul. 20, 1998.

(51) Int. Cl.$^7$ .......................... H01B 12/02; H01L 39/22; C23F 15/00
(52) U.S. Cl. ............................................. 505/234; 505/470
(58) Field of Search ..................................... 505/234, 470

(56) References Cited

U.S. PATENT DOCUMENTS

| | | | |
|---|---|---|---|
| 5,229,358 | 7/1993 | Kumar | 505/1 |
| 5,234,901 | 8/1993 | Saitoh et al. | 505/1 |
| 5,264,412 | 11/1993 | Ota et al. | 505/1 |
| 5,591,696 | 1/1997 | McDevitt et al. | 505/234 |
| 5,719,105 | * 2/1998 | Odagawa et al. | 505/234 |
| 5,998,050 | * 12/1999 | Yamada et al. | 428/700 |

OTHER PUBLICATIONS

Zhou et al., "Improved N–layer materials for high–$T_c$ superconductor/normal–metal/superconductor junctions and superconducting quantum interference device sensors," Applied Physics Letters, vol. 72, No. 7, Feb. 1998, pp. 848–850.

Bishop, David J., et al., "Resistance in High–Temperature Superconductors," Scientific American, Feb. 1993, pp. 48–55.

* cited by examiner

Primary Examiner—Mark Kopec
(74) Attorney, Agent, or Firm—Conley, Rose & Tayon, P.C.

(57) ABSTRACT

To improve the chemical stability, as well as the critical current density ($J_C$) of a superconductive material in an external magnetic field, copper-oxide coating materials have been developed. In some embodiments, these coating materials include a composition with the formula $R_{1-x}Ca_xBa_{2-y}La_yCu_{3-z}M_zO_{7-\delta}$, where R is a rare-earth element (e.g., La, Ce, Pr, Nd, Pm, Sm, Eu, Gd, Tb, Dy, Ho, Er, Tm, Yb, Lu, or Y), M is a transition metal (e.g., Mn, Re, Fe, Os, Co, Rh, Ir, Ni, Pd, Pt, Ag, Au, Zn, Cd, or Hg), $0 \leq x \leq 0.4$, $0 \leq y \leq 0.4$, and $0 \leq z \leq 1.0$. These coating materials are preferably used as a surface layer on superconductive materials to impart corrosion resistance and an improved critical current density when the layers are exposed to magnetic fields

13 Claims, 2 Drawing Sheets

$J_C$ IN HIGH MAGNETIC FIELD OF BI-LAYER AND MULTI-LAYER STRUCTURES FOR HIGH TEMPERATURE SUPERCONDUCTIVE MATERIALS

PRIORITY CLAIM

This application claims the benefit of U.S. Provisional Application No. 60/096,689 entitled "Improved $J_C$ in High Field of Bi-Layer and Multi-Layer Structures For High Temperature Superconductive Materials," filed Jul. 20, 1998.

STATEMENT REGARDING FEDERALLY SPONSORED RESEARCH OR DEVELOPMENT

Research leading to this invention was federally supported, in part, by grant no. N00014-94-1-0706 from the Office of Naval Research and the U.S. Government has certain rights to this invention.

BACKGROUND OF THE INVENTION

1. Field of the Invention

The present invention relates to methods and compositions for relatively high temperature superconductive materials. More particularly, an embodiment of the invention relates to at least partially covering a superconductive material by a coating material, the coating material providing resistance to corrosion and enhanced conductivity to the underlying superconductive material.

2. Brief Description of the Related Art

Superconductive materials have little or no resistance to a direct current. As defined herein the term "critical temperature" ($T_C$) refers to the temperature at which a material has substantially no resistance to a direct current. A superconductor is said to exist in its normal state above $T_C$ and be in its superconductive state below $T_C$; $T_C$ decreases with increasing applied magnetic field (H). In the superconductive state below $T_C$, a superconductor excludes a magnetic field and offers no resistance to a direct current. Type I superconductors exclude the magnetic field from the bulk of the material below a critical magnetic field ($H_C$) that increases with decreasing temperature; however, when $H>H_C$ the material reverts to its normal (i.e., resistive) state. Type II superconductors allow bundles of magnetic flux to penetrate into the bulk without loss of superconductivity in a range of magnetic fields $H_{C1}<H<H_{C2}$; these bundles are referred to as vortices since they are confined by a superconductive vortex current. A type II superconductor remains superconductive below $H_{C2}$ and offers no resistance to a direct current so long as the vortices remain stationary. A direct current has a magnetic field associated with it that increases linearly with the current. If this internal field exceeds $H_C$ (Type I) or $H_{C2}$ (Type II), then the superconductor reverts to its normal (resistive) state. It follows that there is a critical current density $J_C$ beyond which the material loses its superconductive properties. For direct-current applications, $J_C$ is an important feature. Practical superconductors are Type II with a high $H_{C2}$ at a desired operating temperature $T_{OP}<T_C$; Type I superconductors have an $H_C$ which is too low for practical uses. The high-$T_C$ copper-oxide superconductors are Type II with a high $H_{C2}$, but their layered structure and high $T_C$ introduce additional problems. The internal magnetic field associated with a direct current exerts a force on the bundles of magnetic flux trapped within vortices; and if this force is strong enough to cause the vortices to move, the current experiences a resistance. It is desired to find a way to pin the vortices to a stationary configuration to prevent resistance, even if $H>H_{C2}$. Pinning tends to become more difficult as $T_C$ is raised.

The discovery of copper-oxide superconductors having a $T_C \geq 90$ K has introduced the possibility of operating superconductive materials in liquid nitrogen, which boils at 77 K. If a flexible, chemically stable wire or tape, with a $J_C \geq 10^7$ A/cm², can be achieved at a $T_{OP}=77$ K, then superconductive coils may be used to generate high magnetic fields in liquid nitrogen with minimal resistive loss. Realization of this goal would open up a number of technical applications, including levitated trains, high-capacity electrical storage, low-loss power transmission, electric motors and generators, transformers, and high-field magnets. Unfortunately, the copper-oxides are brittle ceramics that have a large electrical anisotropy owing to their layered structure. This situation tends to restrict the development of magnetic coils to superconductive films deposited on a flexible substrate The films having a relatively high $J_C$ at 77 K tend to corrode on exposure to moist air, and at 77 K the vortices tend to become mobile (i.e., the liquid-vortex state) at a $J_C$ lower than is needed.

In order to improve the resistance of these materials to corrosion, a number of analogs of $YBa_2Cu_3O_{7-\delta}$ have been synthesized. The synthesis of $YBa_2Cu_3O_{7-\delta}$ analogs that are resistant to corrosion is described in U.S. Pat. No. 5,591,696 to McDevitt et al., which is incorporated by reference as if set forth herein. McDevitt et. al. shows that derivatives of $YBa_2CU_3O_{7-\delta}$, in which a portion of the Y, Ba, and/or Cu atoms are replaced by a single rare-earth element (e.g., La, Ce, Pr, Nd, Pm, Sm, Eu, Gd, Tb, Dy, Ho, Er, Tm, Yb, Lu, or Y) and an alkaline-earth metal (Ca or Sr), show increased resistance to corrosion. The increase in stability in these systems is believed to arise from blocking access of protonic species to the interior of the lattice. The replacement of Y, Ba, and/or Cu by a rare-earth metal may block channels which are typically present in $YBa_2Cu_3O_{7-\delta}$ materials. The blockage of these channels also tends to increase the stability of the corrosion resistant material's lattice. Moreover, changes in the lattice stress and strain factors which accompany the above mentioned substitutions can alter the reactivity characteristics of these technologically important materials, as can alterations in the electrostatic effects caused by the same metal ion replacements. These chemical isomerizations, however, produce compounds having a somewhat lower $T_C$ than the parent $YBa_2Cu_3O_{7-\delta}$. For example, a sample of $Y_{0.6}Ca_{0.4}Ba_{1.6}La_{0.4}Cu_3O_{6.96}$, which exhibited very little corrosion after 2 months, has a $T_C$ of 80 K, as opposed to 92 K for $YBa_2Cu_3O_{7-\delta}$.

McDevitt et al. further describe the use of corrosion resistant materials, such as $Y_{0.6}Ca_{0.4}Ba_{1.6}La_{0.4}CU_3O_{6.96}$, to encapsulate a thin layer of $YBa_2Cu_3O_{7-\delta}$. The corrosion resistant material protects the more chemically reactive superconductive material $YBa_2CU_3O_{7-\delta}$ from the atmosphere.

The embedded superconductive materials of McDevitt et al., however, do not address the problem in which high $T_C$ superconductive materials tend to lose their superconductivity properties when exposed to strong magnetic fields. Typically, the magnetic response of a type II superconductive material depends on the strength of the applied magnetic field and the temperature. Conventional type II superconductive materials (e.g., superconductive materials having a $T_C$ below about 25 K) tend to show three distinct magnetic states ($H<H_{C1}$) 10, ($H_{C1}<H<H_{C2}$) 20 and ($H>H_{C2}$) 30, as depicted in FIG. 1. The first state 10 is called the Meissner state. In the Meissner state 10 the superconductive material expels any applied magnetic field. The superconductive material will tend to remain in this state as long as the applied magnetic field remains below a certain field strength ($H_{C1}$) 15. This field strength ($H_{C1}$) 15, called the lower critical field strength, is dependent on the temperature of the material.

The second magnetic state 20, the vortex solid state, emerges if an applied magnetic field increases to a value higher than the lower critical field strength ($H_{C1}$) 15. At this point, the magnetic field can penetrate the superconductive material, but not completely or uniformly. Instead, discrete magnetic flux lines known as vortices are formed within the superconducting material. Each of these vortex lines includes flowing currents circulating around a non-superconducting core. When an applied current is passed through a type II superconducting material exposed to an applied magnetic field, it adds to the circulating currents on one side of the vortex and subtracts from the current on the other side. As a result of this action, a force acts on the vortex line. The force tends to make the vortex move in a direction at right angles to both the applied current and the vortex line. In conventional type II superconductive materials, the vortex lines are not significantly moved due to the current flow because of the low temperatures at which these materials exhibit superconductivity. The lines are said to be "frozen" within the superconductive material.

The third state 30 occurs if the applied magnetic field strength reaches a second higher critical point. At this second critical point the superconductive material behaves as a normal metal. This loss of superconductive qualities occurs because increases in the strength of the magnetic field force the vortex lines to move closer together. When the vortex cores, which are non-superconductive, overlap too much, there is no longer any room between the vortices to maintain superconductivity.

A problem with high $T_C$ type II superconductive materials is that they exhibit a fourth magnetic state, known as the vortex liquid state 40, as depicted in FIG. 2. As an applied magnetic field strength is increased, the vortex lines begin to appear. However, at the higher temperatures (e.g., above 25 K) typically used for high $T_C$ superconductive materials, the vortex lines begin to orient themselves in a non-rigid lattice. In effect, the vortices "melt" into a "liquid" state. This allows the vortex lines to move about the superconductive material when a current is applied in the presence of a magnetic field. This movement of the vortex lines tends to dissipate the current, and create resistance within the sample. Thus, high $T_C$ superconductive materials tend to lose their superconductivity as the strength of an applied magnetic field is increased.

It is therefore desirable to increase the chemical stability of copper-oxide superconductive films, while simultaneously increasing the strength of the vortex pinning.

SUMMARY OF THE INVENTION

A superconductive material may be coated with a coating material to protect the superconductive material from corrosion and the effects of applied magnetic fields. Coating materials may include sites that attract and "pin" the magnetic vortex lines that are created within a superconductive material when a magnetic field is applied to the superconductive material. A coating material, in one embodiment, is composed of a compound which includes calcium, barium, lanthanum, copper, oxygen, a rare earth metal, and a transition metal, The coating material may be used as a protective coating over superconductive materials which may also pin the magnetic vortex lines. In one embodiment, the coating material may have the formula $R_{1-x}Ca_xBa_{2-y}La_yCu_{3-z}M_zO_{7-\delta}$, where R is a rare-earth element (e.g., La, Ce, Pr, Nd, Pm, Sm, Eu, Gd, Tb, Dy, Ho, Er, Tm, Yb, Lu, or Y), M is a transition metal (e.g., Sc, La, Ti, Zr, Hf, V, Nb, Ta, Cr, Mo, W, Mn, Re, Fe, Os, Co, Rh, Ir, Ni, Pd, Pt, Ag, Au, Zn, Cd, or Hg), $0 \leq x \leq 0.4$, $0 \leq y \leq 0.4$, and $0 \leq z \leq 1.0$. These coating materials may be used to at least partially cover a superconductive material. Partially covering a superconductive material with a coating material may impart corrosion resistance and improved conductivity to the superconductive material.

In one embodiment, rare-earth elements Pr or Gd are used in the coating materials. Transition metals, in one embodiment, are chosen from Co, Ni, or Zn. Specific examples of these coating materials include, but are not limited to, $Gd_{0.6}Ca_{0.4}Ba_{1.6}La_{0.4}Cu_{2.96}Ni_{0.04}O_{7-\delta}$, $Gd_{0.6}Ca_{0.4}Ba_{1.6}La_{0.4}Cu_{2.94}Ni_{0.06}O_{7-\delta}$, $Gd_{0.6}Ca_{0.4}Ba_{1.6}La_{0.4}Cu_{2.90}Co_{0.10}O_{7-\delta}$, $Gd_{0.6}Ca_{0.4}Ba_{1.6}La_{0.4}Cu_{2.80}Co_{0.20}O_{7-\delta}$, and $Gd_{0.6}Ca_{0.4}Ba_{1.6}La_{0.4}Cu_{2.90}Zn_{0.1}O_{7-\delta}$.

BRIEF DESCRIPTION OF THE DRAWINGS

Further advantages of the present invention will become apparent to those skilled in the art with the benefit of the following detailed description of the preferred embodiments and upon reference to the accompanying drawings in which.

DETAILED DESCRIPTION OF PREFERRED EMBODIMENTS

To improve the chemical stability, as well as the critical current density ($J_C$), of a superconductive material in an external magnetic field, copper-oxide superconductive materials have been developed in which replacement of a portion of the Y, Ba, and/or Cu atoms by rare-earth elements and transition metals (e.g., Sc, La, Ti, Zr, Hf, V, Nb, Ta, Cr, Mo, W, Mn, Re, Fe, Os, Co, Rh, Ir, Ni, Pd, Pt, Ag, Au, Zn, Cd, or Hg) creates a coating superconductive material which may be used as a barrier layer over typical high $T_C$ superconductive materials (e.g., $YBa_2Cu_3O_{7-\delta}$, $Tl_2Ba_2Ca_2Cu_3O_{10}$, $Bi_2Sr_2CaCu_2O_8$, $HgBa_2Ca_2Cu_3O_9$). These coating superconductive materials are preferably used as a surface layer on superconductive layers to impart corrosion resistance and improved conductivity when the layers are exposed to magnetic fields.

U.S. Pat. No. 5,591,696 to McDevitt shows that derivatives of the superconductive material $YBa_2Cu_3O_{7-\delta}$, in which a portion of the Y, Ba, and/or Cu atoms are replaced by a rare-earth element (e.g., La, Ce, Pr, Nd, Pm, Sm, Eu, Gd, Tb, Dy, Ho, Er, Tm, Yb, Lu, or Y) and an alkaline-earth element (Ca or Sr), shows increased resistance to corrosion. This corrosion resistant material may be used to embed $YBa_2Cu_3O_{7-\delta}$ layers to impart improved corrosion resistance to the $YBa_2Cu_3O_{7-\delta}$ layers. The embedding of superconducting materials with the derivatives of McDevitt et al., however, fails to address the problem that high $T_C$ superconductive materials tend to lose their superconductivity properties when exposed to strong magnetic fields.

In one embodiment, a coating material composed of calcium, barium, lanthanum, copper, oxygen, a rare earth metal, and a transition metal may be used to inhibit corrosion of an underlying superconductive material and improve conductivity of the underlying superconductive material in the presence of magnetic fields. The coating material, in one embodiment, has the formula $R_{1-x}Ca_xBa_{2-y}La_yCu_{3-z}M_zO_{7-\delta}$, where R is a rare-earth element (e.g., La, Ce, Pr, Nd, Pm, Sm, Eu, Gd, Tb, Dy, Ho, Er, Tm, Yb, Lu, or Y), M is a transition metal (e.g., Ti, Zr, V, Cr, Mo, W, Mn, Re, Fe, Os, Co, Rh, Ir, Ni, Pd, Pt, Ag, Au, Zn, Cd, or Hg), $0 \leq x \leq 0.4$, $0 \leq y \leq 0.4$, and $0 \leq z \leq 1.0$. Specific examples of these coating materials include, but are not limited to, $Gd_{0.6}Ca_{0.4}Ba_{1.6}La_{0.4}Cu_{2.96}Ni_{0.04}O_{7-\delta}$, $Gd_{0.6}Ca_{0.4}Ba_{1.6}La_{0.4}Cu_{2.94}Ni_{0.06}O_{7-\delta}$, $Gd_{0.6}Ca_{0.4}Ba_{1.6}La_{0.4}Cu_{2.90}Co_{0.1}O_{7-\delta}$, $Gd_{0.6}Ca_{0.4}Ba_{1.6}La_{0.4}Cu_{2.80}Co_{0.20}O_{7-\delta}$, and $Gd_{0.6}Ca_{0.4}Ba_{1.6}La_{0.4}Cu_{2.90}Zn_{0.1}O_{7-\delta}$.

Figure 1:
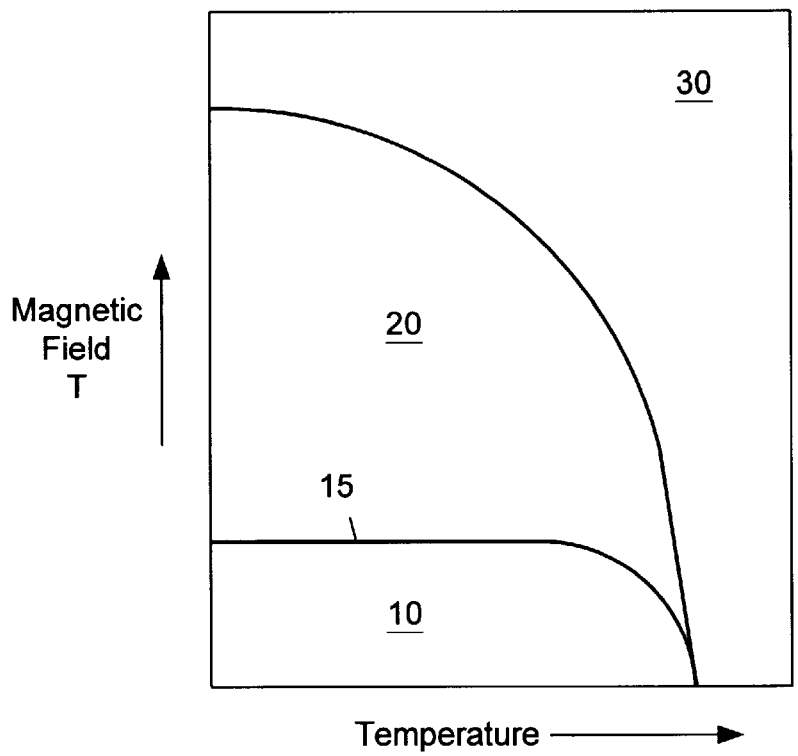
FIG. 1 depicts a magnetic phase diagram of a conventional type II superconductive material.
Figure 2:
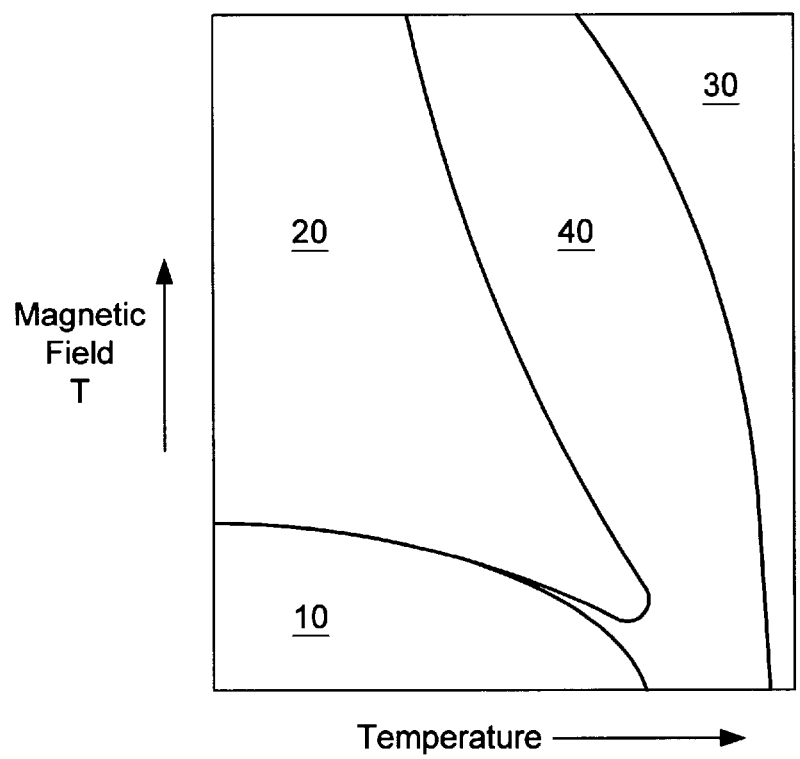
FIG. 2 depicts a magnetic phase diagram of a high $T_C$ type II superconductive material.
Figure 3A:
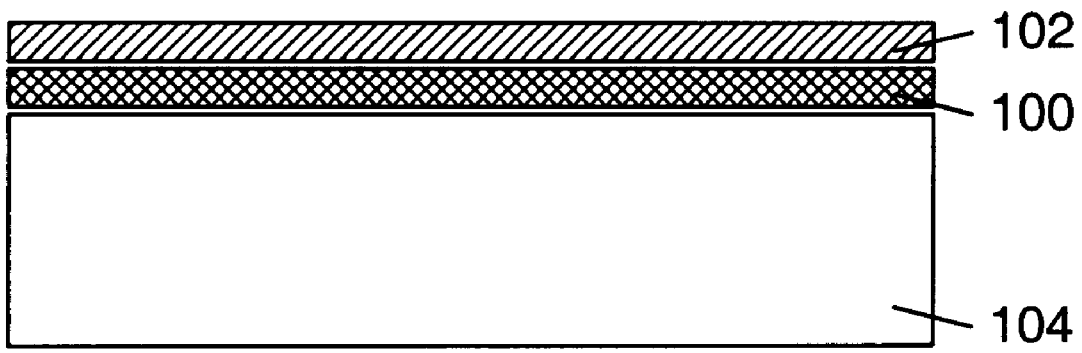
FIG. 3a depicts a layer of a corrosion-resistant superconductive material superimposed over a chemically reactive superconductive layer.

In one embodiment, a superconductive material 100 is preferably at least partially covered within a layer of a coating material 102, as depicted in FIG. 3A. The superconductive material is preferably formed upon a support material 104 (e.g., a ceramic support or a metal tape) In this manner, the superconductive material 100 may be protected from air and moisture. More importantly, the presence of the transition metals within the coating material 102 may reduce movement of the vortices within the underlying superconductive material 100. This reduction of movement may lead to increased conductivity and current carrying capacity through the underlying superconductive material 100 in the presence of magnetic fields up to about 10 Tesla (T).

Figure 3B:
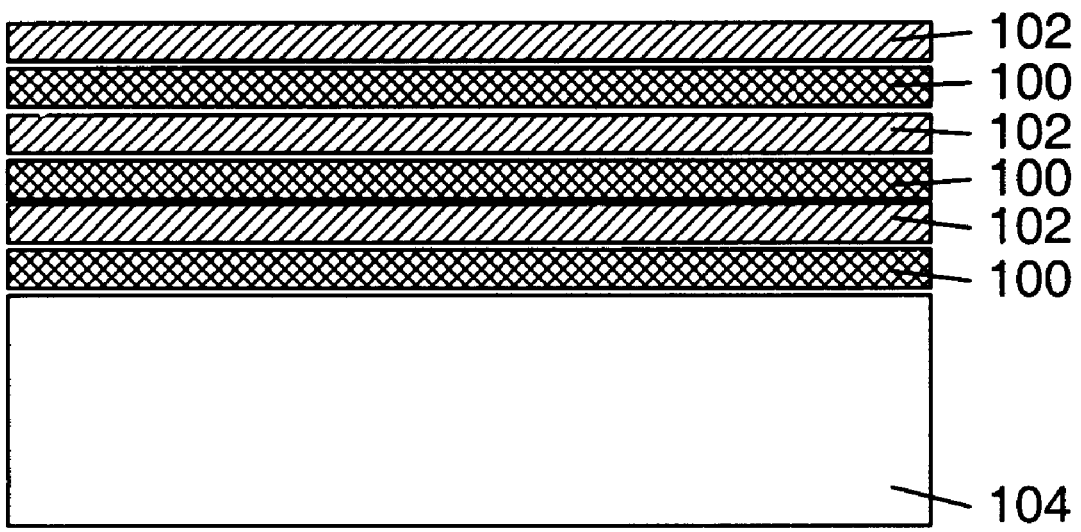
FIG. 3b depicts alternating layers of corrosion-resistant superconductive materials and chemically reactive superconductive layer in a multi-layer structure.

In another embodiment, alternating layers of superconductive material 100 and coating material 102 are formed upon a support structure 104 to create a multi-layer structure, as depicted in FIG. 3b. The multi-layer structure may possess good corrosion resistance and enhanced conductivity in the presence of magnetic fields. These layered structures may be used in place of non high temperature superconductors in devices such as trains, superconducting magnets, electrical storage devices, electric motors, and electric generators. In general, the layered structures may be used to replace a portion of the non high temperature superconductors in such devices The layered structures may be in the form of a wire or tape.

When coating material 102 is used to cover a superconductive material 100, the superconductivity of the underlying superconductive material remains substantially unchanged. Additionally, the transition metal dopants within the coating material 102 are believed to act as flux pinning centers for vortices which may be formed in the underlying superconductive material 100. A problem with high $T_C$ type II superconductive materials is that they exhibit a fourth magnetic state known as the vortex liquid state. As an applied magnetic field strength is increased, vortex lines begin to appear within a superconductive material. When the superconductive material is kept at higher temperatures (e.g., above 77 K), the vortex lines tend to move about the superconductive material in response to an applied current. The movement of the vortex lines tends to dissipate the current, and thus resistance is created within the sample. The presence of transition metal dopants in the flux pinning compound 102 creates pinning centers that attract the magnetic cores of the vortices. This attraction of the magnetic cores inhibits (i.e., pins) the movement of the vortices when a current is applied through the underlying superconductive material. By inhibiting the movement of the vortices, the underlying superconductive material may exhibit decreased resistance in the presence of magnetic fields.

Generally, the coating materials may be produced using standard superconductor synthetic techniques. In one embodiment, mixtures of metal oxides may be annealed to form the coating material. The coating material is generally formed by modifications of existing high $T_C$ superconductive materials. In one embodiment, the coating material may be formed from derivatives of the class of coating materials having the general structure $Y_{1-y}Ca_yBa_{2-y}La_yCu_3O_{7-\delta}$. To form derivatives of this compound a rare earth element may be substituted for yttrium during synthesis of the superconductive material. It is believed that the presence of a rare earth element improves the corrosion resistivity of the coating material. While a variety of stoichiometries may be used, it was found that having y in the range from where $0 \leq y \leq 0.4$ provides both high $T_C$ values as well as good corrosion resistance.

The derivatives also include a transition metal. Since copper is also a transition metal, derivatives may be formed by substituting a portion of the copper with a transition metal. Thus, the general formula of a coating material may be $R_{1-x}Ca_xBa_{2-y}La_yCu_{3-z}M_zO_{7-\delta}$, where R is a rare-earth element, M is a transition metal. Generally, as a transition metal is added to the coating material, copper is removed, such that the stoichiometry of copper and/or transition metal remains the same. It believed that as more transition metal is added to the coating material, the $T_C$ of the coating material is lowered. In one embodiment, the amount of transition metal substituted for copper may be limited such that the $T_C$ of the coating material remains above about 40 K. If the amount of transition metal used creates a coating material with a $T_C$ that is less than about 40 K, a portion of the transition metal may be replaced with copper. If too much transition metal is removed, however, the ability of the coating material to protect the underlying superconductive material from the effects of strong magnetic fields may be diminished. The optimal amount of transition metal used in the coating material is the value which will give the highest $T_C$ while giving the best protection against magnetic fields. In one embodiment, it was found that the optimal range for the substitution of copper with a transition metal is $0 < z < 1.0$.

The following examples are included to demonstrate embodiments of the invention. Those of skill in the art, in light of the present disclosure, should appreciate that many changes may be made in the specific examples that are disclosed and still obtain a like or similar result without departing from the spirit and scope of the invention.

EXAMPLES

Synthesis of $R_{1-x}Ca_xBa_{2-y}La_yCu_{3-z}M_zO_{7-\delta}$ Samples

The $R_{1-x}Ca_xBa_{2-y}La_yCu_{3-z}M_zO_{7-\delta}$ samples, where R is a rare-earth metal and M is a transition metal, have been synthesized by known solid state reactions. Methods for forming superconductive bulk samples are described in U.S. Pat. No. 5,229,358 to Kumar and U.S. Pat. No. 5,264,412 to Ota et al., both of which are incorporated by reference as if set forth herein. Stoichiometric amounts of metal oxides/carbonates are well mixed and fired at about 900° C. for 15 hr. The resulting powders are ground, pelletized, and fired at $\leq$ about 920° C. for 36 hr. In an oxygen atmosphere with several intermediate grinding and pelletizing steps. The resulting pellets were postannealed in an oxygen atmosphere at 430° C. for 24 hr.

Compound 1

Compound 1 having the structure $Gd_{0.6}Ca_{0.4}Ba_{1.6}La_{0.4}Cu_{2.96}Ni_{0.04}O_{7-\delta}$, is prepared as described above using $Gd_2O_3$ (0.2175 g), $CaCO_3$ (0.0801 g), $BaCO_3$ (0.5738), $La_2O_3$ (0.1303 g), CuO (0.4709 g), and NiO (0.0060 g).

Compound 2

Compound 2 having the structure $Gd_{0.6}Ca_{0.4}Ba_{1.6}La_{0.4}Cu_{2.94}Ni_{0.06}O_{7-\delta}$, is prepared as described above from $Gd_2O_3$ (0.2175 g), $CaCO_3$ (0.0801 g), $BaCO_3$ (0.5738), $La_2O_3$ (0.1303 g), CuO (0.4678 g), and NiO (0.0090 g).

Compound 3

Compound 3 having the structure $Gd_{0.6}Ca_{0.4}Ba_{1.6}La_{0.4}Cu_{2.9}Zn_{0.1}O_{7-\delta}$, is prepared as described above from $Gd_2O_3$ (0.2175 g), $CaCO_3$ (0.0801 g), $BaCO_3$ (0.5738), $La_2O_3$ (0.1303 g), CuO (0.4614 g), and ZnO (0.0163 g).

Compound 4

Compound 4 having the structure $Gd_{0.6}Ca_{0.4}Ba_{1.6}La_{0.4}Cu_{2.8}Co_{0.2}O_{7-\delta}$, is prepared as described above from $Gd_2O_3$ (0.2175 g), $CaCO_3$ (0.0801 g), $BaCO_3$ (0.5738), $La_2O_3$ (0.1303 g), CuO (0.4455 g), and $Co_3O_4$ (0.0321).

Testing of Coating Materials

Coating materials were tested for superconductivity by measuring the resistance of a thin layer of the coating material as the temperature of the coating material is lowered using known testing instrumentation. The critical temperature is the temperature at which the resistance drops below the instrument detection limit.

A superconductive material coated with the coating material was subjected to a magnetic field varying from about 0 T to about 10 T. The change in the current passing through the embedded superconductive material was measured as the magnetic field was increased.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for producing an at least partially covered superconductive material comprising:
   covering at least a portion of the superconductive material with a coating material, the coating material comprising calcium, barium, lanthanum, copper, oxygen, a rare earth metal, and a transition metal;
   wherein the coating material has a critical temperature of greater than about 40 K.

2. The method of claim 1, wherein the coating material comprises the formula $R_{1-x}Ca_xBa_{2-y}La_yCu_{3-z}M_zO_{7-\delta}$, wherein R is a rare-earth element, M is a transition metal, $0<x\leq0.4$, $0<y\leq0.4$, $0<z<1.0$, and $\delta\leq1$.

3. The method of claim 1, wherein the rare-earth element comprises La, Ce, Pr, Nd, Pm, Sm, Eu, Gd, Tb, Dy, Ho, Er, Tm, Yb, Lu, or Y.

4. The method of claim 1, wherein the transition metal comprises Sc, La, Ti, Zr, Hf, V, Nb, Ta, Cr, Mo, W, Mn, Re, Fe, Os, Co, Rh, Ir, Ni, Pd, Pt, Ag, Au, Zn, Cd, or Hg.

5. The method of claim 1, wherein the superconductive material comprises $YBa_2Cu_3O_{7-\delta}$, $Tl_2Ba_2Ca_2Cu_3O_{10}$, $Bi_2Sr_2CaCu_2O_8$, $HgBa_2Ca_2Cu_3O_9$, $Tl_2Ba_2CaCu_2O_8$, $Bi_2Sr_2Ca_2Cu_3O_{10}$ or $RBa_2Cu_3O_{7-\delta}$, where R is a rare-earth element.

6. The method of claim 1, wherein the rare-earth metal comprises Pr or Gd, and wherein the transition metal comprises Co, Ni, or Zn.

7. The method of claim 1, wherein the coating material comprises the structure $Gd_{0.6}Ca_{0.4}Ba_{1.6}La_{0.4}Cu_{3-v}M_vO_{7-\delta}$ where M is a transition metal, and where $0<v<1$.

8. The method of claim 7, wherein the transition metal comprises Sc, La, Ti, Zr, Hf, V, Nb, Ta, Cr, Mo, W, Mn, Re, Fe, Os, Co, Rh, Ir, Ni, Pd, Pt, Ag, Au, Zn, Cd, or Hg.

9. The method of claim 7, wherein the transition metal comprises Ni, Co, or Zn and where $0<v<0.05$.

10. The method of claim 1, wherein the coating material substantially reduces corrosion of the underlying superconductive material.

11. The method of claim 1, wherein the coating material substantially enhances conductivity of the underlying superconductive material when the material is exposed to magnetic fields having a strength between about 1 to about 10 T.

12. The method of claim 1, further comprising forming additional layers of superconductive material upon the coating material.

13. The method of claim 1, further comprising testing the conductivity of the superconductive material in the presence of a magnetic field.

* * * * *